US012587096B2

(12) United States Patent
Kruiskamp et al.

(10) Patent No.: US 12,587,096 B2
(45) Date of Patent: Mar. 24, 2026

(54) POWER CONVERTER WITH INDUCTOR CURRENT MONITORING CIRCUIT BASED ON INDUCTOR VOLTAGE

(71) Applicant: Renesas Design Netherlands B.V., 's-Hertogenbosch (NL)

(72) Inventors: Marinus Wilhelmus Kruiskamp, 's-Hertogenbosch (NL); Jasper Velner, Deventer (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 746 days.

(21) Appl. No.: 17/830,885

(22) Filed: Jun. 2, 2022

(65) Prior Publication Data

US 2023/0396164 A1     Dec. 7, 2023

(51) Int. Cl.
| | |
|---|---|
| *H02M 3/158* | (2006.01) |
| *G01R 19/25* | (2006.01) |
| *H02M 1/00* | (2006.01) |
| *H02M 3/157* | (2006.01) |

(52) U.S. Cl.
CPC ............ *H02M 3/158* (2013.01); *G01R 19/25* (2013.01); *H02M 1/0009* (2021.05); *H02M 1/0041* (2021.05); *H02M 3/157* (2013.01)

(58) Field of Classification Search
CPC .. H02M 3/158; H02M 1/0009; H02M 1/0041; H02M 3/157; G01R 19/25
See application file for complete search history.

(56) References Cited

U.S. PATENT DOCUMENTS

| | | | |
|---|---|---|---|
| 7,868,595 B1 | 1/2011 | Smith | |
| 10,220,839 B2 * | 3/2019 | Lavoie | G06V 20/56 |
| 10,554,126 B2 | 2/2020 | Kruiskamp et al. | |
| 2008/0298106 A1 | 12/2008 | Tateishi | |
| 2010/0194370 A1 | 8/2010 | Cheng | |
| 2011/0018516 A1 | 1/2011 | Notman et al. | |
| 2011/0169535 A1 * | 7/2011 | Kyles | H03L 7/0807 |
| | | | 327/156 |
| 2012/0235653 A1 | 9/2012 | Chen et al. | |
| 2014/0277812 A1 | 9/2014 | Shih et al. | |

(Continued)

FOREIGN PATENT DOCUMENTS

| | | |
|---|---|---|
| CN | 102377338 A | 3/2012 |

OTHER PUBLICATIONS

"DA14580 Bluetooth Low Energy 4.2 SoC", Datasheet, Revision 3.4, Nov. 9, 2016.

(Continued)

*Primary Examiner* — Rafael O De Leon Domenech
(74) *Attorney, Agent, or Firm* — SCULLY, SCOTT, MURPHY & PRESSER, P.C.

(57) ABSTRACT

A current monitoring circuit for use with an inductor having a magnetizing phase and a de-magnetizing phase is presented. The current monitoring circuit has a voltage controlled oscillator and a first counter. The voltage controlled oscillator generates a clock signal based on a voltage across the inductor. The first counter generates a counter value using the clock signal. The current monitoring circuit may be implemented as part of a switched mode power supply having an inductor coupled to a pair of power switches and a controller adapted to generate a control signal to control the pair of power switches based on the counter value.

24 Claims, 17 Drawing Sheets

(56)            References Cited

U.S. PATENT DOCUMENTS

| 2014/0340122 | A1 | | 11/2014 | Savanth et al. | |
|---|---|---|---|---|---|
| 2015/0069989 | A1 | * | 3/2015 | Yau | |
| 2016/0233768 | A1 | * | 8/2016 | de Cremoux | ....... H02M 3/1588 |
| 2020/0195155 | A1 | * | 6/2020 | Colbeck | ............ H02M 3/33571 |

OTHER PUBLICATIONS

"A Mostly Digital VCO-Based CT-SDM With Third-Order Noise Shaping," A. Babaie-Fishani et al., IEEE Journal of Solid-State Circuits, vol. 52, No. 8, pp. 2141-2153, Aug. 2017.
"A Time-Domain-Controlled Current-Mode Buck Converter With Wide Output Voltage Range," J. Kang et al., IEEE Journal of Solid-State Circuits, vol. 54, No. 3, pp. 865-873, Mar. 2019.
"High Frequency Buck Converter Design Using Time-Based Control Techniques," S. J. Kim et al., IEEE Journal of Solid-State Circuits, vol. 50, No. 4, pp. 990-1001, Apr. 2015.
"A 4-Phase 30-70 MHz Switching Frequency Buck Converter Using a Time-Based Compensator," S. J. Kim et al., IEEE Journal of Solid-State Circuits, vol. 50, No. 12, pp. 2814-2824, Dec. 2015.
"Comparators" in "CMOS Analog Integrated Circuits: High-Speed and Power-Efficient Design", Tertulien Ndjountche, Chapman and Hall/CRC, USA, ISBN: 978-1-4398-5491-4, pp. 225-241, May 24, 2011.

* cited by examiner

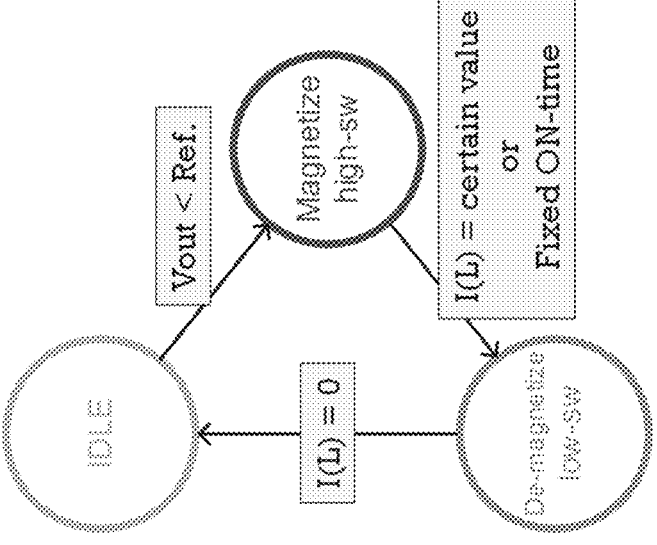
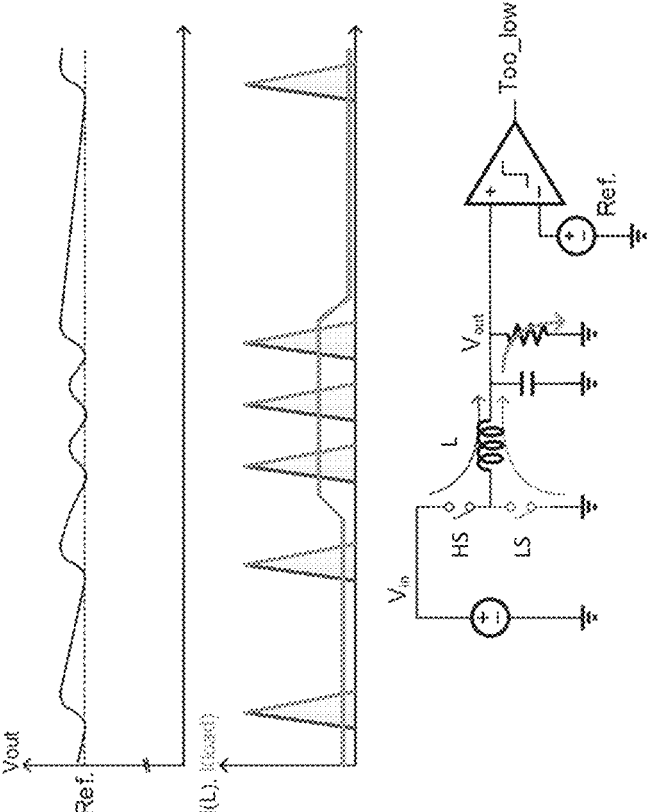
Figure 1 (prior art)

610 generating with a voltage controlled oscillator a clock signal based on a voltage across the inductor; and

620 generating with a first counter a counter value using the clock signal to monitor the inductor current.

600

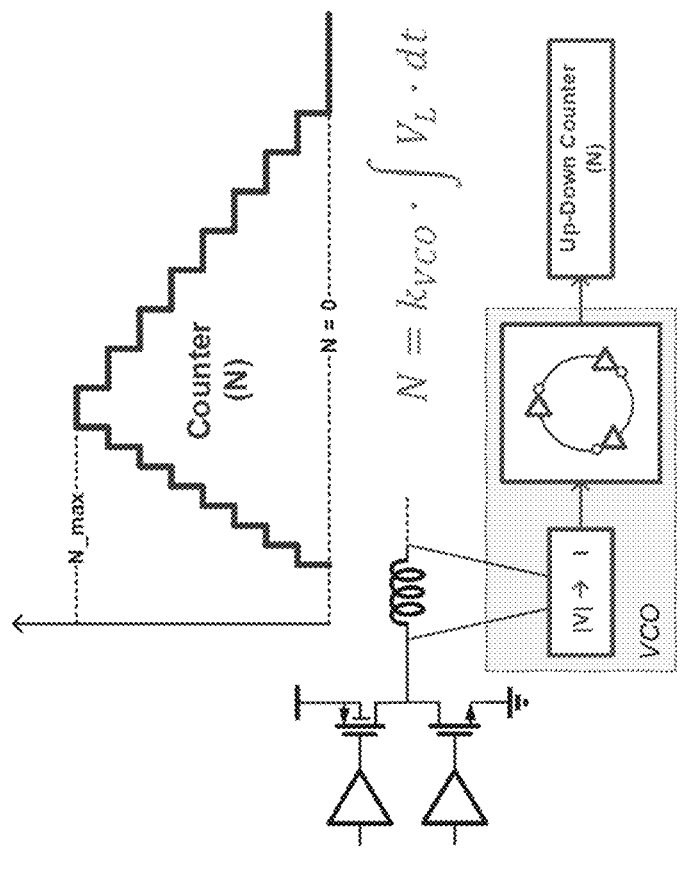
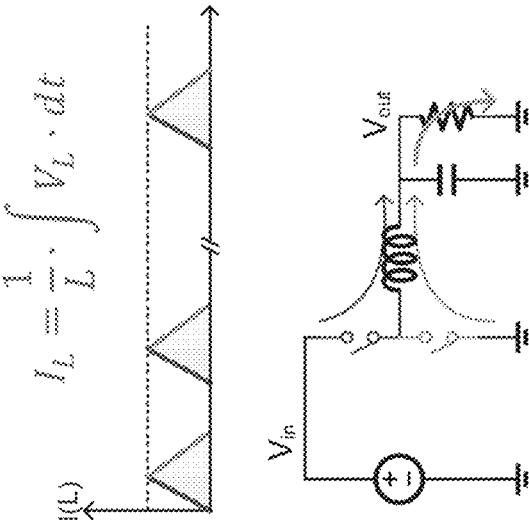
Figure 8A

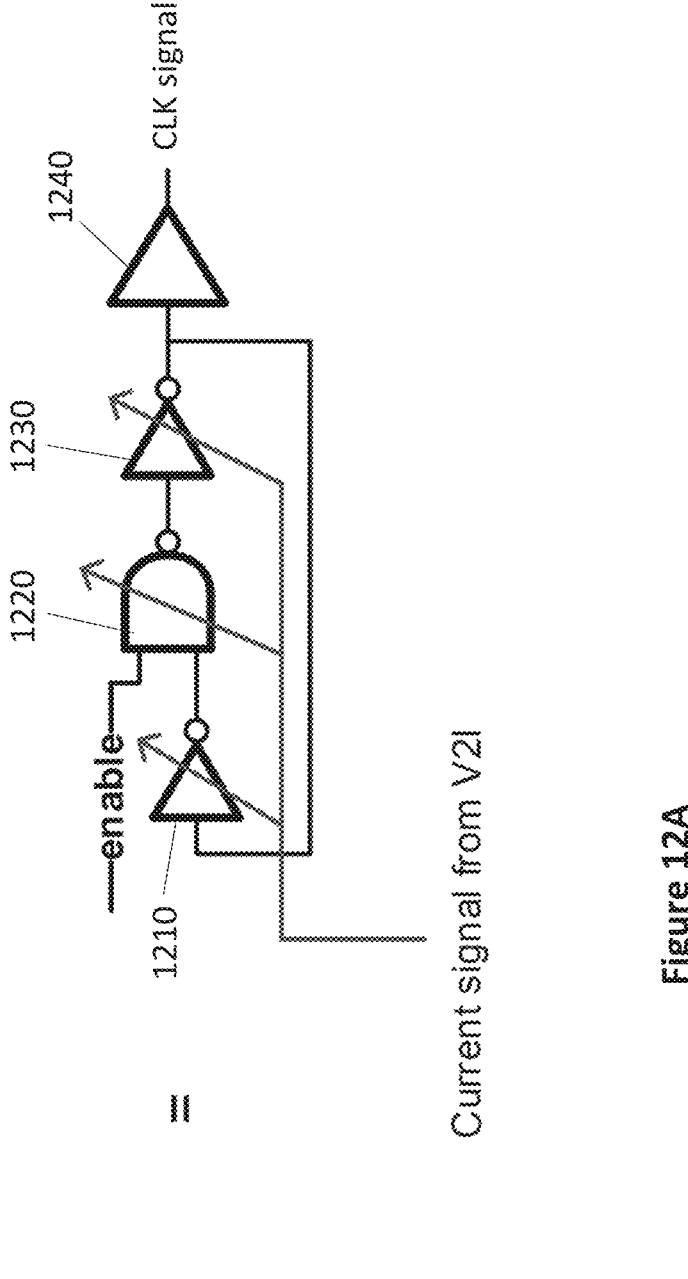
CLK signal
1240
1230
1220
enable
1210
Current signal from V2I
=
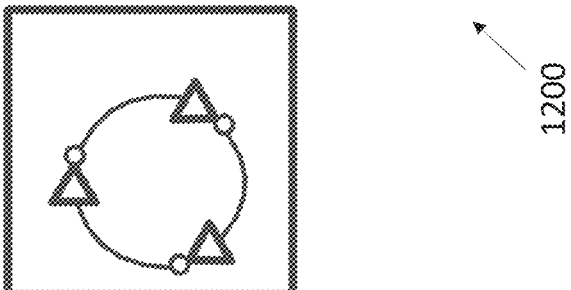
1200
Figure 12A

POWER CONVERTER WITH INDUCTOR CURRENT MONITORING CIRCUIT BASED ON INDUCTOR VOLTAGE

TECHNICAL FIELD

The present disclosure relates to a current-controlled power converter provided with an inductor current monitoring circuit. In particular, the present disclosure relates to a DC-DC power converter such a buck, boost or buck boost provided with a current monitoring circuit based on a voltage controlled oscillator coupled to a counter.

BACKGROUND

Switched mode power converters require accurate control of the timing for turning on and off the power switches. This requires monitoring the inductor current of the converter both quickly and accurately to identify when the inductor current reaches the zero value. This is achieved by implementing relatively complex comparator circuits which often increases the size and power consumption of the converter. The smaller the size of the inductor, the more challenging is the design of the comparator circuit.

It is an object of the disclosure to address one or more of the above mentioned limitations.

SUMMARY

According to a first aspect of the disclosure there is provided a current monitoring circuit for use with an inductor having a magnetizing phase and a de-magnetizing phase, the current monitoring circuit comprising a voltage controlled oscillator adapted to generate a clock signal based on a voltage across the inductor; and a first counter configured to generate a counter value using the clock signal.

Optionally, the counter value is proportional to an inductor current through the inductor.

Optionally, the clock signal has a frequency proportional to an absolute value of the voltage across the inductor.

Optionally, the voltage controlled oscillator comprises a voltage to current converter adapted to convert the voltage across the inductor into a current signal; and a current controlled oscillator adapted to generate the clock signal based on the current signal.

Optionally, the clock signal is configured to control a counting frequency of the first counter. For instance the first counter may be an up-down counter.

Optionally, the first counter counts up or down based on a polarity of the voltage across the inductor.

Optionally, during the magnetizing phase the first counter is counting up from a first counter value to a second counter value, and during a de-magnetizing phase the first counter is counting down from the second counter value to the first counter value. For instance the first counter value may be zero and the second counter value may be a predetermined value.

Optionally, the current monitoring circuit comprises a second counter.

For instance the polarity of the voltage across the inductor may be used to activate one counter during the magnetizing phase and the other counter during the de-magnetizing phase.

Optionally, during the magnetizing phase the second counter counts from an initial counter value to an end counter value, and during the de-magnetizing phase the first counter counts from the initial counter value to the end counter value.

For instance, the first and second counters may be down counters counting down from the initial counter value to the end counter value. The initial and end counter values may be pre-determined values.

Optionally, the first and second counters are ripple counters.

Optionally, the voltage to current converter comprises a first circuit configured to generate a current signal during the magnetizing phase, and a second circuit configured to generate a current signal during the de-magnetizing phase.

Optionally, the current controlled oscillator comprises a ring oscillator. For instance the ring oscillator may include an odd numbers of inverters greater than one. For example, 3, 5 or 7 inverters.

Optionally, the ring oscillator comprises a NAND gate coupled to a plurality of inverters.

According to a second aspect of the disclosure there is provided a switched mode power supply comprising an inductor coupled to a pair of power switches; a current monitoring circuit comprising a voltage controlled oscillator adapted to generate a clock signal based on a voltage across the inductor; and a first counter configured to generate a counter value using the clock signal; and a controller adapted to generate a control signal to control the pair of power switches based on the counter value.

Optionally, the voltage controlled oscillator comprises a voltage to current converter adapted to convert the voltage across the inductor into a current signal; and a current controlled oscillator adapted to generate the clock signal based on the current signal.

Optionally, the pair of power switches comprises a first power switch and a second power switch, the controller being operable in three states: a first state during which the first power switch is on, while the second power switch is off to magnetize the inductor, a second state during which the first power switch is off while the second power switch is on to de-magnetize the inductor and a third state during which the first and second power switches are both off.

Optionally, wherein during the first state the counter value increases from a first counter value to a second counter value, and when the counter value reaches the second counter value the controller starts operating in the second state during which the counter value decreases from a second counter value to a first counter value.

Optionally, wherein in the third state the controller is configured to disable the voltage to current converter and the oscillator and to reset the first counter.

Optionally, the switched mode power supply comprises a second counter wherein during the magnetizing phase the second counter counts from an initial counter value to an end counter value, and during the de-magnetizing phase the first counter counts from the initial counter value to the end counter value.

For instance the initial and end counters values may be pre-determined values.

Optionally, wherein the controller is configured to change state when the counter value reaches the end value.

Optionally, the switched mode power supply comprises a calibration circuit configured to calibrate the counter value and to calculate an absolute value of the current through the inductor.

Optionally, wherein the power supply has a switching frequency, and wherein the voltage controlled oscillator operates at a frequency greater than the switching frequency.

The switched mode power supply according to the second aspect of the disclosure may comprise any of the features described above in relation to the current monitoring circuit according to the first aspect of the disclosure.

According to a third aspect of the disclosure there is provided a method of monitoring an inductor current comprising generating with a voltage controlled oscillator a clock signal based on a voltage across the inductor; and generating with a first counter a counter value using the clock signal to monitor the inductor current.

The options described with respect to the first aspect of the disclosure are also common to the third aspect of the disclosure.

According to a fourth aspect of the disclosure there is provided a method of operating a switched mode power supply comprising an inductor coupled to a pair of power switches, the method comprising generating with a voltage controlled oscillator a clock signal based on a voltage across the inductor;

generating with a first counter a counter value using the clock signal to monitor the inductor current; and generating a control signal to control the pair of power switches based on the counter value.

The options described with respect to the second aspect of the disclosure are also common to the fourth aspect of the disclosure.

DESCRIPTION OF THE DRAWINGS

The disclosure is described in further detail below by way of example and with reference to the accompanying drawings, in which:

FIG. 1 is a conventional DC-DC switched mode power converter;

FIG. 8A is a diagram illustrating the operation of the converter of FIG. 7;

FIG. 12A is a diagram of a ring oscillator;

DESCRIPTION

FIG. 1 shows a conventional DC-DC switched mode power converter and illustrates the principle of a Buck-converter operating in a Discontinuous Conduction Mode (DCM). An example of such a converter is provided in technical document DA14580 "Bluetooth Low Energy" https://www.dialog-semiconductor.com/sites/default/files/da14580_fs_3v4.pdf The switching of the power switches (high side HS, and low side LS) happens when the inductor current crosses certain thresholds. The converter has three states, a magnetizing (or magnetization) state (HS on, LS off) to magnetize the inductor L, a demagnetizing (or demagnetization) state (HS off, LS on) to de-magnetize L, and an idle state during which both the HS and LS switches are turned off. The transition from the demagnetizing state to the idle state must occur when the current through the inductor crosses 0 A. Therefore the inductor current should be detected quickly and accurately. In practice this is performed using a continuous-time comparator.

Figure 2:
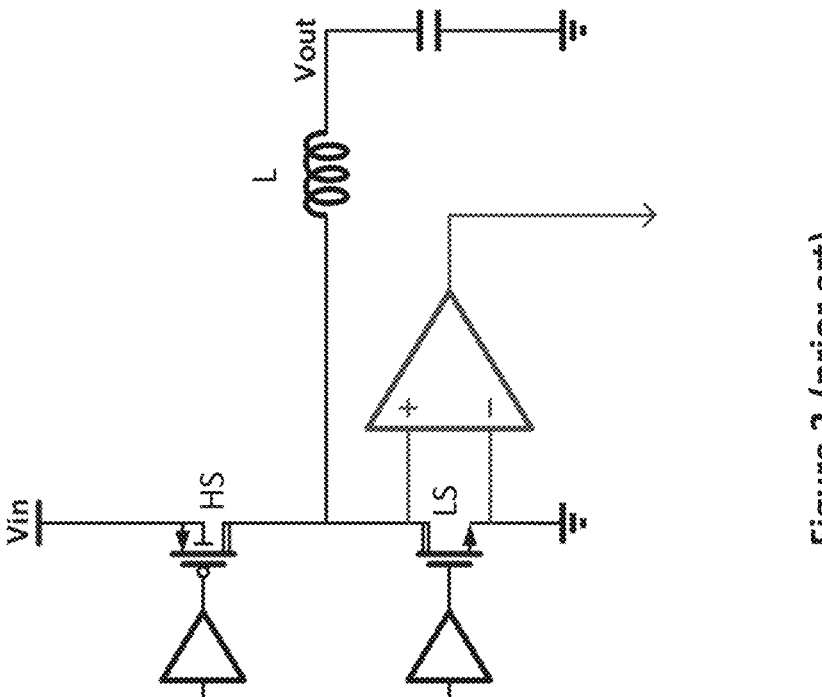
FIG. 2 is diagram of a buck converter provided with a continuous-time comparator according to the prior art.

FIG. 2 is diagram of a buck converter provided with a continuous-time comparator. The continuous-time comparator is provided across the low side switch LS.

The requirements for the zero-cross comparator to be both fast and accurate often lead to complex and/or power-hungry circuits. This is for instance the case when using small inductors (leading to very short magnetizing and demagnetizing phases) and in low-power applications (mostly in the idle-phase with sporadic magnetizing/demagnetizing cycles).

The zero-cross comparator should consume negligible power during the idle-state but at the same-time be able to wake-up quickly and accurately to detect the zero-crossing.

Figure 3:
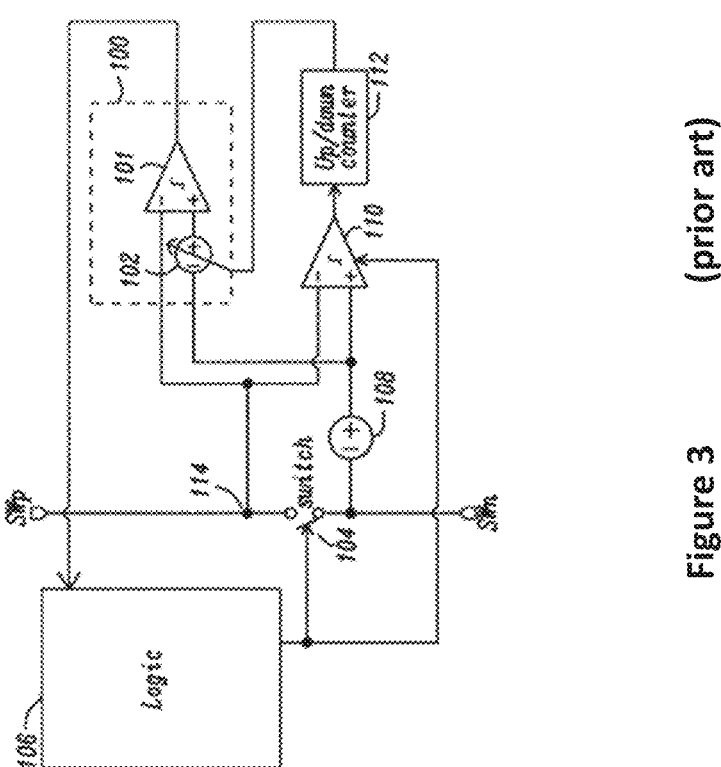
FIG. 3 is a diagram of circuit provided with a continuous comparator having a calibration loop according to the prior art.

FIG. 3 is a diagram of circuit provided with a continuous comparator having a calibration loop as described in U.S. Pat. No. 10,554,126B2.

Voltage controlled oscillators VCOs have been reported for ADCs. A VCO-ADC has been described in A. Babaie-Fishani and P. Rombouts, "A Mostly Digital VCO-Based CT-SDM With Third-Order Noise Shaping," in IEEE Journal of Solid-State Circuits, vol. 52, no. 8, pp. 2141-2153, August 2017. In this ADC (see FIG. 1 of Babaie), a VCO implemented by a ring-oscillator is used to convert a voltage to a frequency which is then fed to a counter, acting as an integrator. Voltage controlled oscillators VCOs have also been reported in DC-DC converters.

Figure 4:
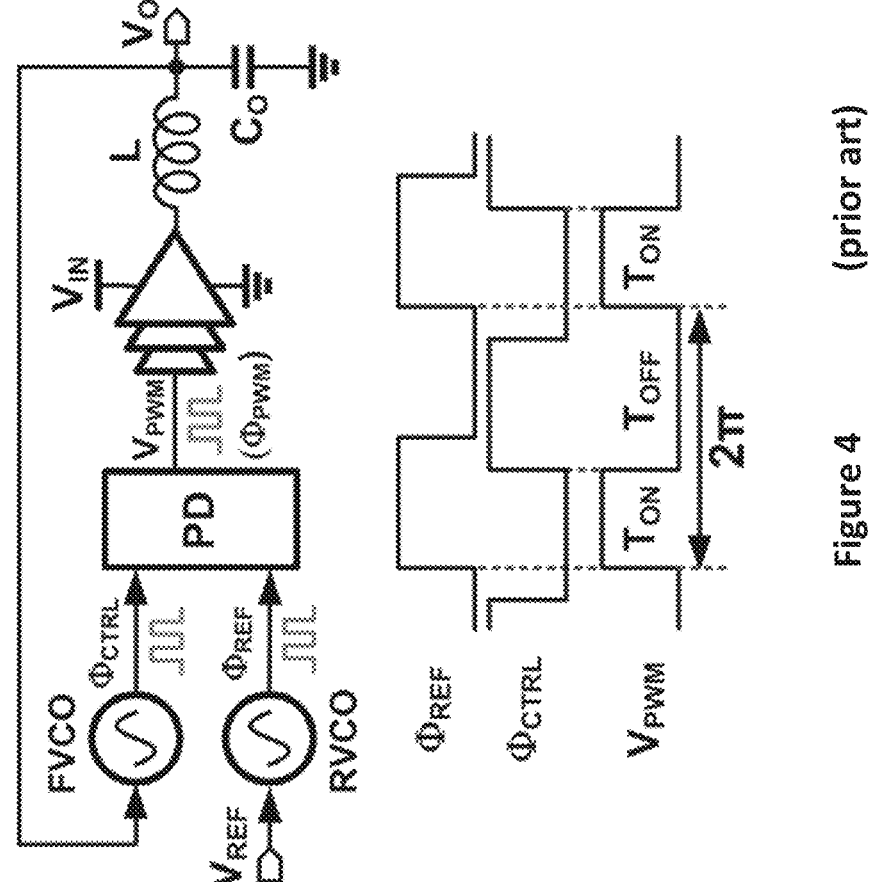
FIG. 4 is a diagram of a converter provided with a voltage controlled oscillators according to the prior art.

FIG. 4 is a diagram of a converter provided with a voltage controlled oscillators VCO according to the prior art, as described in S. J. Kim et al., "High Frequency Buck Converter Design Using Time-Based Control Techniques," in IEEE Journal of Solid-State Circuits, vol. 50, no. 4, pp. 990-1001, April. The converter is provided with a voltage-based controller. The circuit from Kim uses VCOs to convert both the reference voltage as well as the output voltage to a time domain signal (clock-signals). The phase information of those clock signals is used by the controller to drive the switches in the output stages of the DCDC-converter. Additional examples can be found in J. Kim, R. K. Nandwana, Q. Khan, R. C. N. Pilawa-Podgurski and P. K. Hanumolu, "A 4-Phase 30-70 MHz Switching Frequency Buck Converter Using a Time-Based Compensator," in IEEE Journal of Solid-State Circuits, vol. 50, no. 12, pp. 2814-2824, December 2015.

Figure 5:
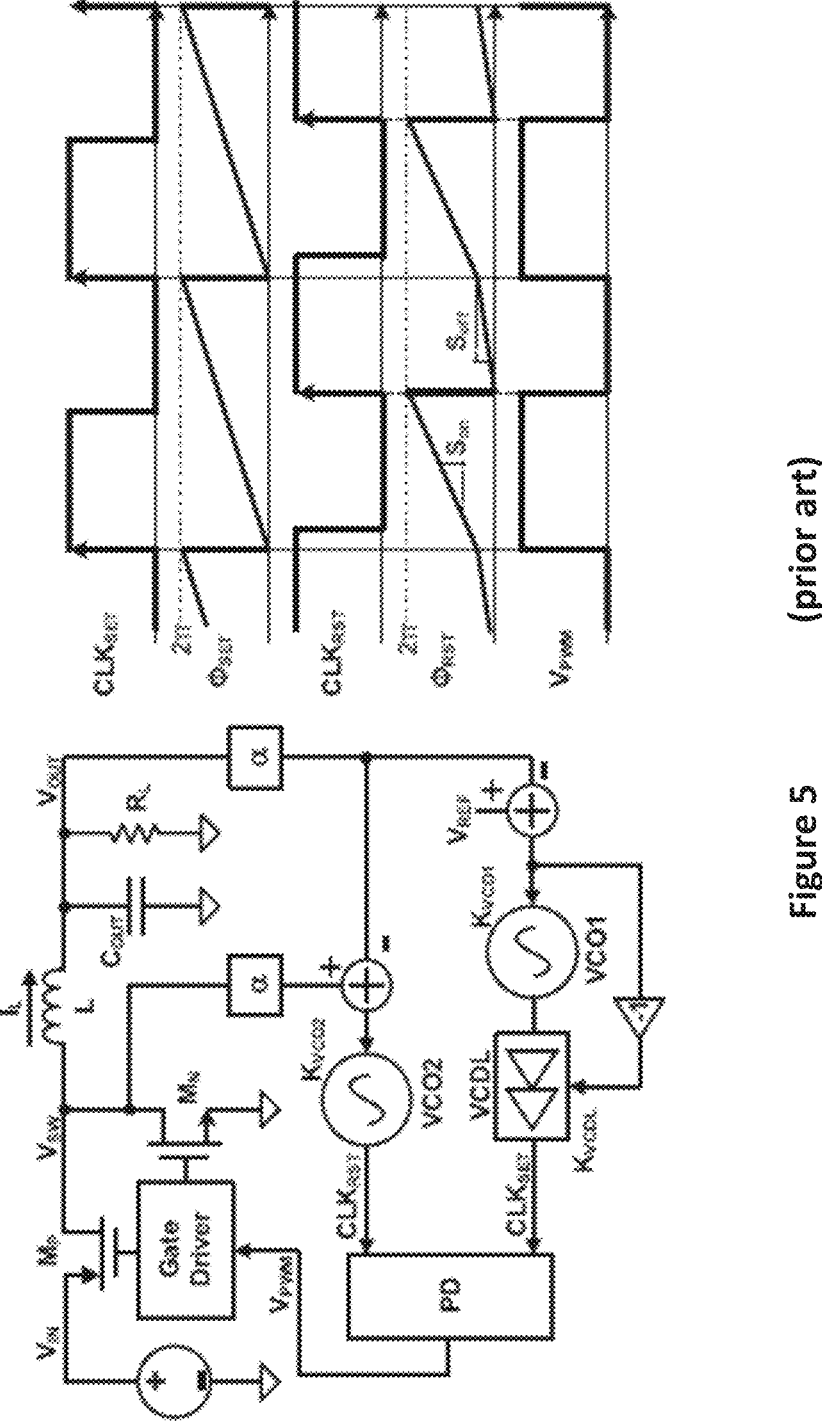
FIG. 5 is a diagram of a current-mode buck converter according to the prior art.

FIG. 5 is diagram of a current-mode buck converter as described according to the prior art as described in J. Kang, J. Park, M. Jeong and C. Yoo, "A Time-Domain-Controlled Current-Mode Buck Converter with Wide Output Voltage Range," in IEEE Journal of Solid-State Circuits, vol. 54, no. 3, pp. 865-873, March 2019. In this approach two VCOs (VCO1 and VCO2) are used in connection with a phase-detector (PD) and the phase information of the output of VCO2 is used to control the switching operation. The VCOs are running at the same frequency as the switching frequency of the Buck-converter. The circuit of Kang operates in a continuous conduction mode CCM only, which is not efficient for low power applications.

Figure 6:
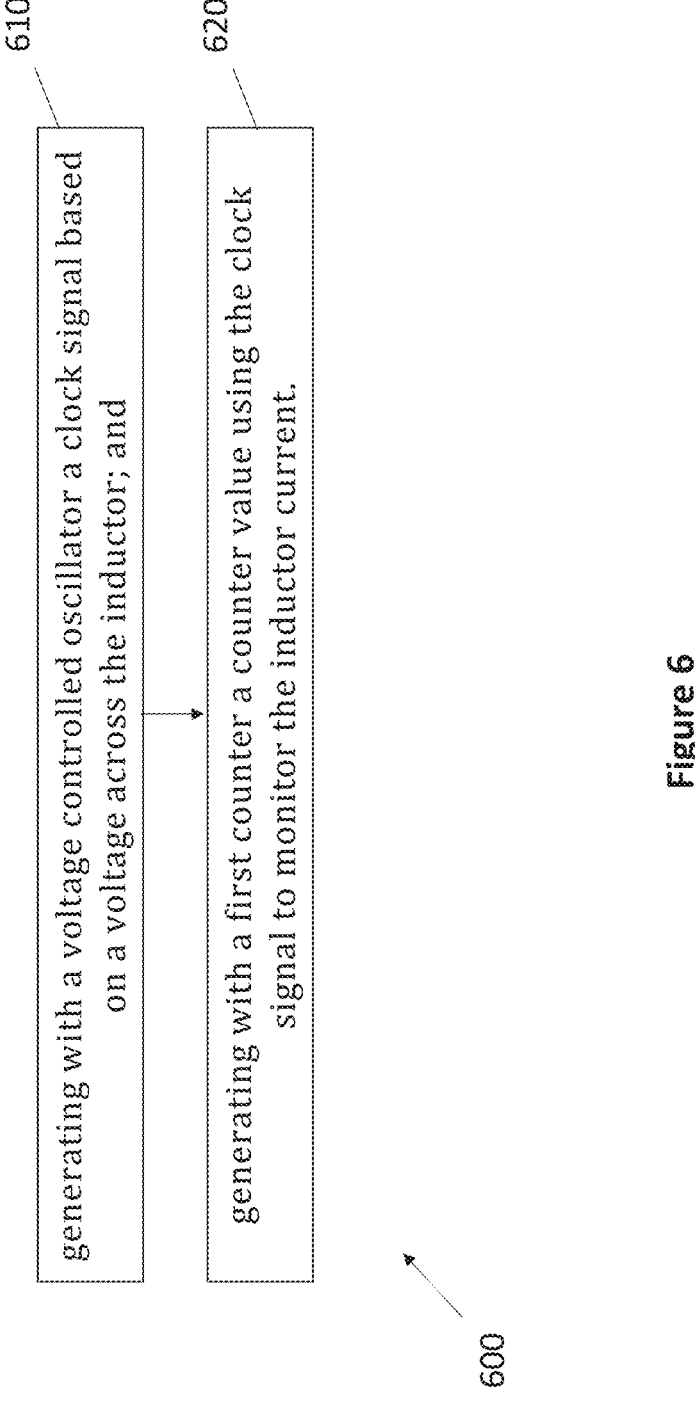
FIG. 6 is a is a flow chart of a method for monitoring an inductor current according to the disclosure.

FIG. 6 is a flow chart of a method for monitoring an inductor current according to the disclosure.

At step 610 a clock signal is generated with a voltage controlled oscillator. The clock signal is based on a voltage across the inductor. For instance the clock signal may have a frequency proportional to an absolute value of the voltage across the inductor.

At step 620 a counter value is generated with a first counter to monitor the inductor current. The counter value is generated using the clock signal. The counter value is a number of counts N, in which N is an integer.

The polarity of the voltage across the inductor may be detected so that the first counter counts up or down based on the polarity of the voltage across the inductor. For instance during the magnetizing state the voltage is positive and the first counter is counting up, during the de-magnetizing state the voltage is negative and the first counter is counting down.

Alternatively a plurality of counters may be used, for instance a first counter and a second counter. In this case the polarity of the voltage across the inductor may be used to activate one counter during the magnetizing phase and the other counter during the de-magnetizing phase.

The voltage across the inductor may be converted into a current signal using a V2I converter. In this case the clock signal is generated based on the current signal.

The method 600 may be used to operate a switched mode power converter, such as a buck, a boost or a buck-boost converter. In this case a control signal is generated to control a pair of power switches based on the counter value.

Figure 7:
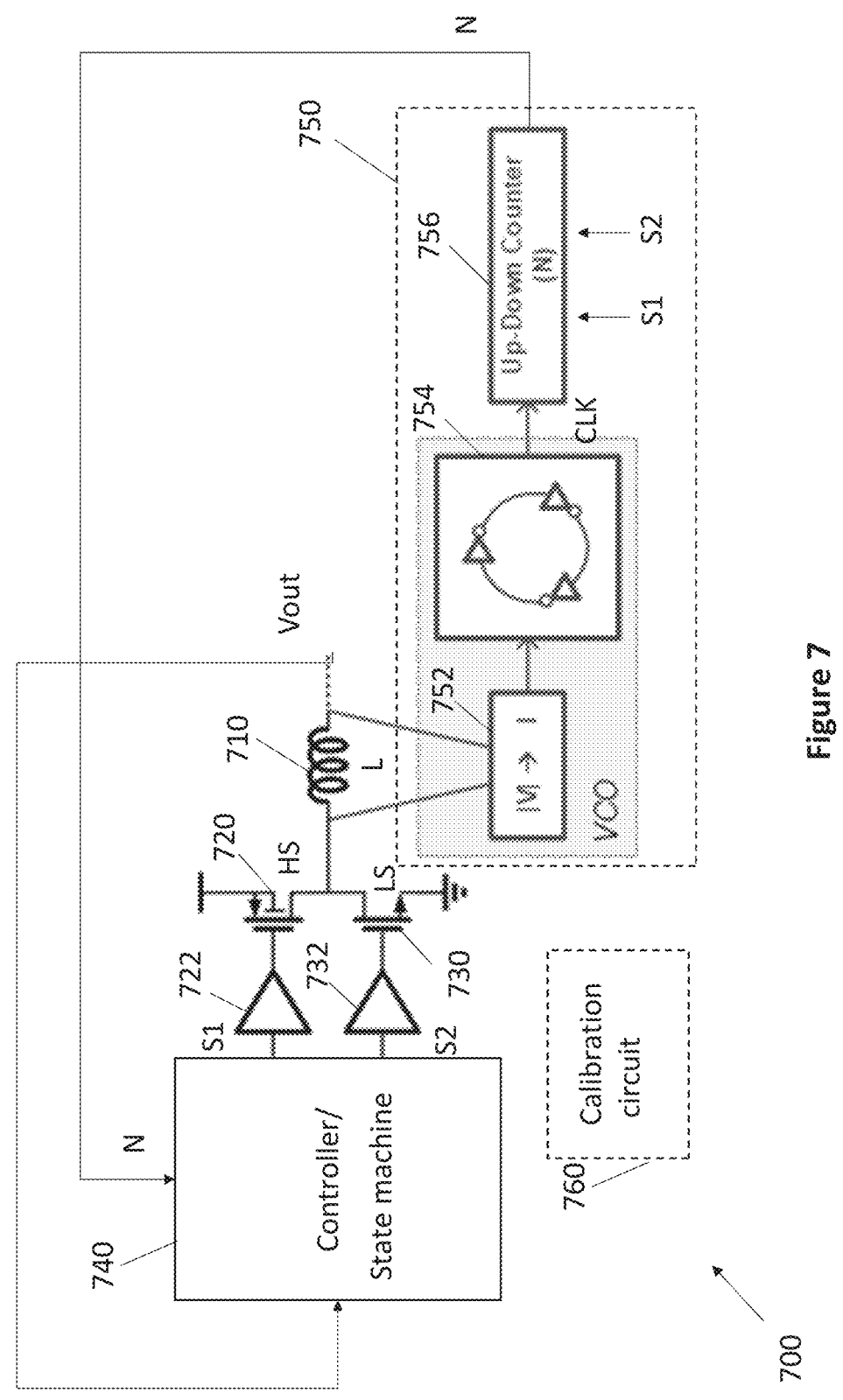
FIG. 7 is a diagram of a switched mode power converter provided with a current monitoring circuit according to the disclosure.

FIG. 7 shows a switched mode power converter provided with a current monitoring circuit according to the disclosure.

The switched mode power converter 700 includes an inductor L 710 coupled to a high side power switch HS 720 and a low side power switch LS 730 at a switching node. The switched mode power converter also includes a controller 740 to control the power switches via a high side driver 722 and a low side driver 732. A current monitoring circuit 750 is provided to monitor a current through the inductor L. The current monitoring circuit 750 includes a voltage to current converter 752, an oscillator, such as a ring oscillator 754 and a counter 756. The voltage to current converter 752 and the oscillator 754 form a voltage controlled oscillator VCO. The voltage to current converter 752 is adapted to measure a voltage across an inductor L and to generate a current signal. The oscillator 754 is adapted to generate a clock signal based on the current signal. The first counter 756 is configured to generate a number of counts using the clock signal.

The controller 740 has a first input for receiving the output Vout of the converter, a second input for receiving the number of counts N (counter value) from the counter, and several outputs for providing a plurality of control signals. In this example two control signals are represented and labelled S1, S2. The signals S1 and S2 are configures to control the states (on or off) of the HS and LS power switches. A signal S3 (not shown) can be used to enable or disable the current monitoring circuit 750. The signal S3 could be derived from the signals S1 and S2 using a NOR gate. In this case during the magnitizing phase: S1=ON, S2=OFF → S3=ACTIVE; during the demagnetizing: S1=OFF, S2=ON → S3=ACTIVE; and during the Idle phase: S1=OFF, S2=OFF → S3=IDLE.

The controller 740 may be implemented in different fashions. For instance the controller 740 may include comparator for comparing the output voltage Vout with a reference voltage and a state machine operable in a plurality of states that would include a magnetizing state, a de-magnetizing state and an idle state.

Optionally a calibration circuit 760 may also be provided. The calibration circuit 760 is configured to calibrate the counter value N and to calculate an absolute value of the current through the inductor.

FIG. 8A illustrates the operation of the converter 700. In first approximation the current in the inductor L is proportional to the integrated voltage across the inductor according to $$I_L = \frac{1}{L} \int V_L dt$$

Such an integration can be performed in the digital domain by converting the absolute voltage across the inductor L to a clock signal having a clock frequency and then feeding the clock signal to an up/down counter. The clock signal has a frequency proportional to the absolute of the voltage across the inductor. The polarity (positive or negative) of the voltage across the inductor is used to control the counting direction of the counter.

In operation the voltage to current converter 752 measures the voltage across the inductor $V_L$ and converts the voltage $V_L$ into a current signal I. This current signal I is then used to operate the ring oscillator 754 which generates a clock signal CLK. The clock signal CLK is received by the counter 756 to control the counting frequency or counting rate.

The polarity of the clock signal can be derived from the state of the power switches. During the inductor magnetizing phase (HS switch is closed LS switch is open) the voltage $V_L$ is positive and the counter 756 is counting up from N=0 to N=N_max. Similarly, during the inductor de-magnetizing phase (HS switch is open LS switch is closed) the voltage $V_L$ is negative and the counter 756 is counting down from N=N_max to N=0. The value N_max may be a pre-determined value. The frequency of the CLK signal, hence the counting rate of the counter, is proportional to the voltage across the inductor.

The counter 756 receives control signals from the controller to control the counting direction so that in the magnetizing phase the counter counts up and in the de-magnetizing phase the counter counts down. For instance the counter 756 may receive the same signals S1 and S2 that control the switches HS and LS. When S1 is on the counter is counting up and when S2 is on the counter is counting down. Alternatively the counter may receive a signal derived from the voltage at the switching node between the HS and LS switches.

The counter 756 provides the number of counts N in which N represents the integration of the voltage $V_L$ across the inductor L over a discrete time element dt according to:

$$N = k_{VCO} \int V_L dt$$

In this equation $k_{VCO}$ is the gain (conversion factor) of the VCO in Hz/V. The number of counts N is received by the controller 740 to generate a control signal for controlling the switching operation of the power switches HS and LS.

Figure 8B:
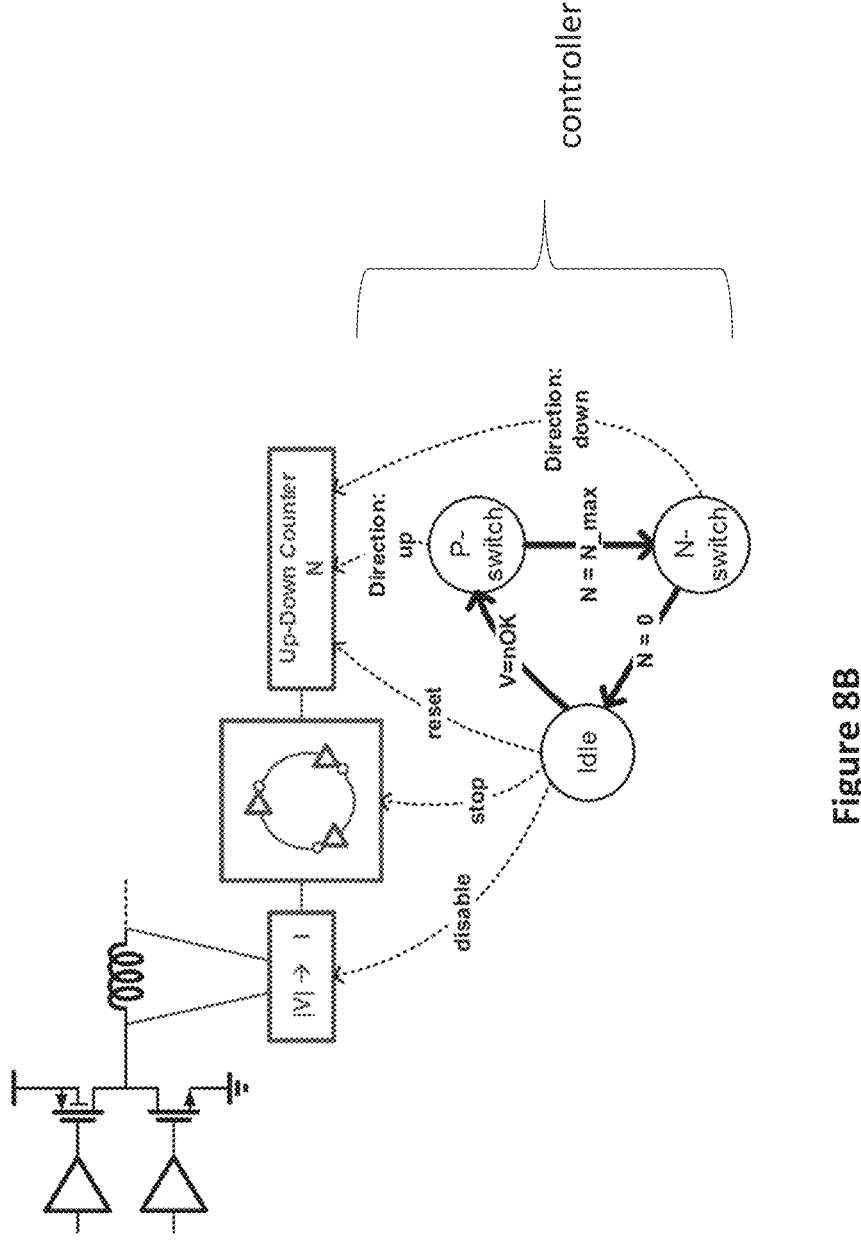
FIG. 8B is a diagram illustrating the operation of a controller used in FIG. 7.

FIG. 8B illustrates the operation of the controller. The controller 740 is operable in three states: a first state referred to as magnetizing state, a second state referred to as de-magnetizing state, and a third state also referred to as idle state. In the first (magnetizing) state, the high side power switch HS is switched on, while the low side power switch LS is switched off to magnetize the inductor L. In the second (de-magnetizing) state the HS power switch is switched off while the LS power switch is switched on to de-magnetise the inductor L. In the third (idle) state the HS and LS power switches are both off.

During the first state N increases indicating that L is being magnetized. When N reaches its maximum value Nmax, the controller 740 starts operating in the second state and N decreases from N_max down to 0. When N=0 both switches are turned off and the controller is in a so called idle state. In the idle state the controller 740 disables the voltage to current converter 752 and the oscillator 754 and reset counter 756.

As explained above, the counter value N is proportional to the current $I_L$ in the inductor L. To derive the absolute value of the current $I_L$, the ratio between 1/L and $k_{VCO}$ must be known or estimated. This may be because the inductor has a particular current rating or because the circuit is most efficient at a certain maximum current. $k_{VCO}$ can vary from chip to chip and L can vary from inductor to inductor and they both can vary over temperature.

A calibration circuit may be provided for performing a calibration based on a known absolute value of the current $I_L$. The calibration circuit includes a current sensor and a comparator for comparing sensed current with the value of N at the time of measurement.

Such a calibration step could be performed only occasionally and will therefore have negligible impact on the power consumption of the system. If the ratio between 1/L and $k_{vco}$ is not known exactly, it is still possible to detect the zero-crossing accurately since that is a relative measurement. If the counter is reset before the magnetize/demagnetize cycle, the current will be 0 A when the counter is back to 0 after counting up and down an equal amount, so as long as $k_{VCO}$/L is identical during the counting-up and counting-down, the situation that N=0 corresponds to IL=0.

The current monitoring circuit 750 is therefore implemented with a simple analog V2I converter coupled to digital circuits. This permits to benefit from newer processes and improved performances with respect to both size and power consumption. This mostly digital approach also allows for more flexibility of use regarding the control scheme of the converter. The converter can be implemented with a small inductor, for instance 100 nH or less while maintaining a relatively simple current monitoring circuit.

The monitoring circuit of the disclosure can also be implemented with several counters.

Figure 9:
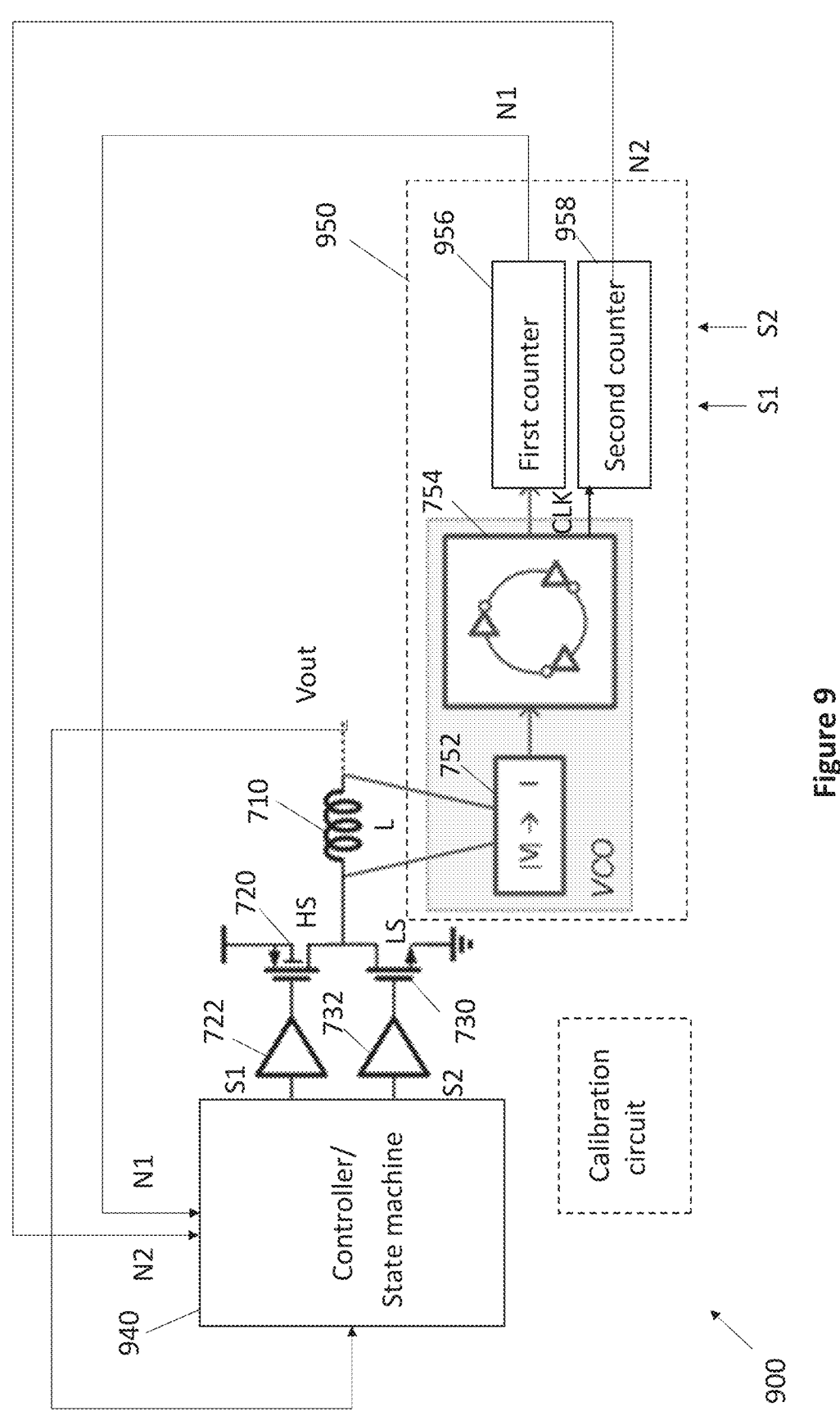
FIG. 9 is a diagram illustrating a switched mode power converter provided with another current monitoring circuit according to the disclosure.

FIG. 9 is a diagram illustrating a switched mode power converter provided with another current monitoring circuit according to the disclosure.

The switched mode power converter 900 shares many similar components to those illustrated in the circuit 700 of FIG. 7. The same reference numerals have been used to represent corresponding components and their description will not be repeated for sake of brevity. In this example the current monitoring circuit 950 includes two counters referred to as first counter 956 and second counter 957. The first and second counters are each configured to count down from Nmax to zero but at different times. This approach is easier to implement compared to the example of FIG. 7 using a single up/down counter.

The first counter 956 also referred to as de-magnetizing counter receives the clock signal CLK from the oscillator 754 and generates a number of counts N1. Similarly the second counter 958 also referred to as magnetizing counter receives the clock signal CLK from the oscillator 754 and generates a number of counts N2. N2 is used to go from magnitizing to demagnetizing-state, while N1 is used to go from demagnetizing- to idle-state.

Figure 10:
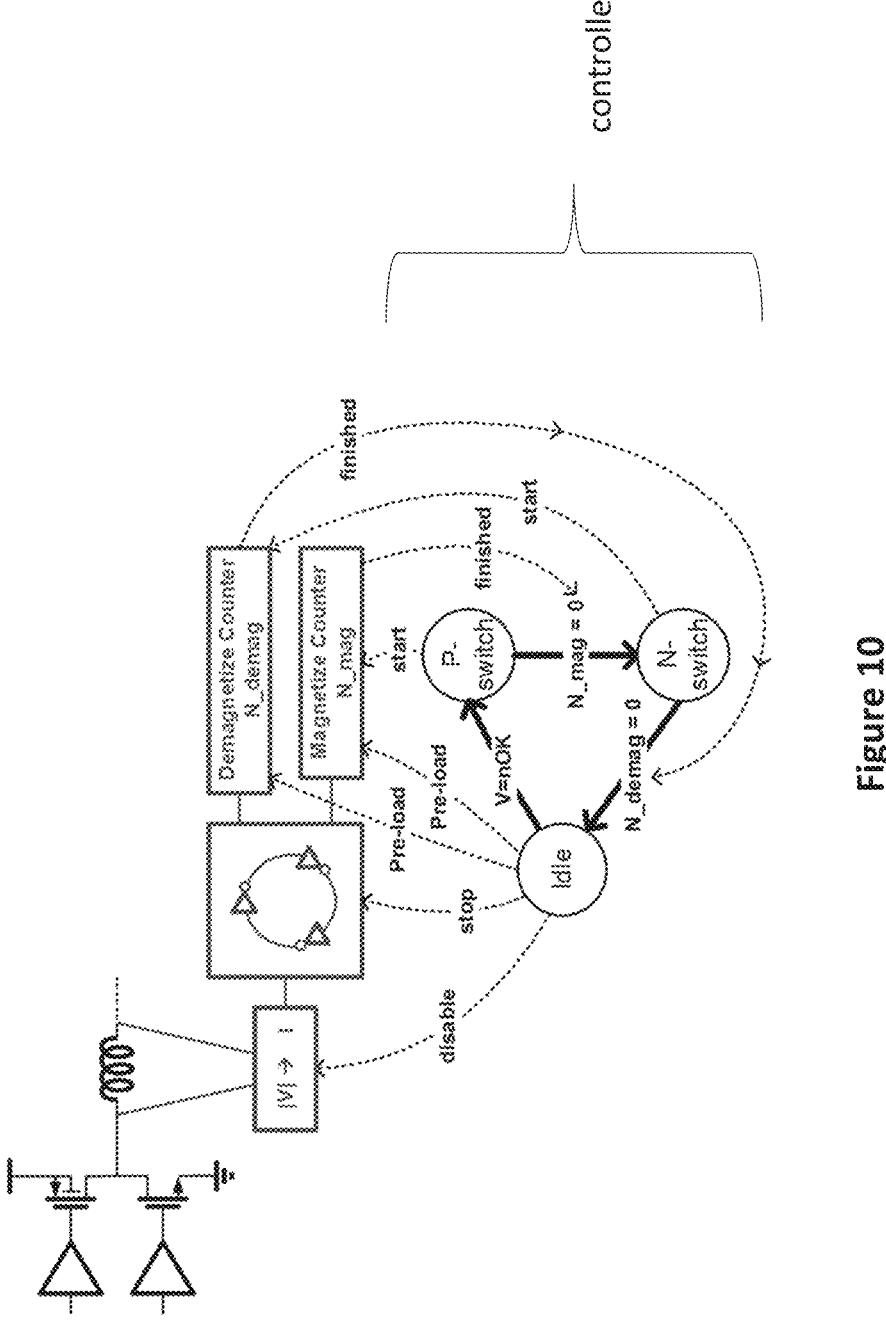
FIG. 10 is a diagram illustrating the operation of the switch mode power converter of FIG. 9.

FIG. 10 illustrates the operation of the switch mode power converter of FIG. 9. The controller preloads the first counter 956 and the second counter 958 with a N_max value that corresponds to the intended peak current in the inductor L. The first and second counters count-down from N_max to zero sequentially; the first counter 956 being used during the de-magnetizing phase and the second counter 958 during the magnetizing phase.

During the first (magnetizing) state the counter 958 counts down from N_max to 0. When N reaches zero, the controller starts operating in the second state (de-magnetizing) state during which the counter 956 counts down from N-max to 0. When N=0 both switches are turned off and the controller is in a so called idle state. In the idle state the controller disables the voltage to current converter 752 and the oscillator 754. The transition from the idle state to the magnetizing state would occur based on the output voltage becoming too low. The first and second counters 956 and 958 may be implemented as ripple counters. The current monitoring circuit 950 may permit faster operation and lower consumption compared with the current monitoring 750 of FIG. 7.

Figure 11:
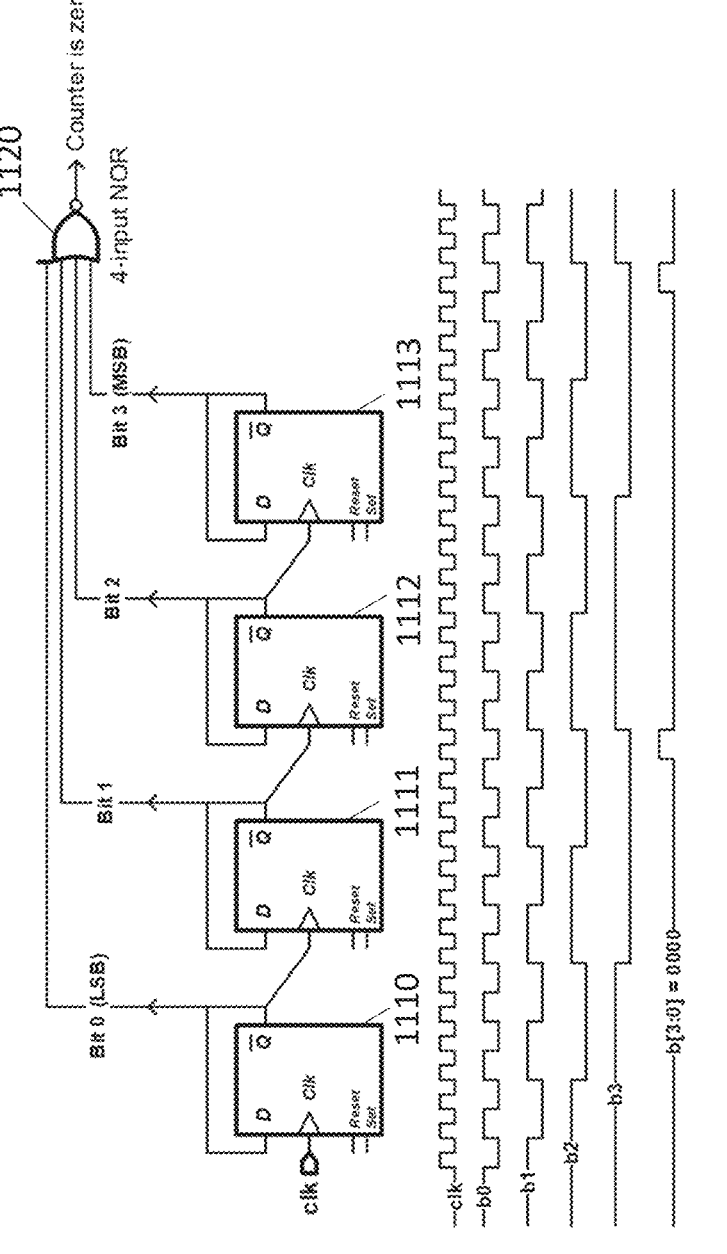
FIG. 11 is a diagram of a ripple counter.

FIG. 11 shows a diagram of a ripple counter. In this exemplary implementation the ripple counter is a 4-bit counter that includes four flip-flops 1110, 1111, 1112, 1113 coupled to a NOR gate 1120. The output of each flip-flop is the clock for the next flip-flop. As a result, only the first flip-flop 1110 runs at full speed, hence consuming full power. The next flip-flops 1111 runs at half the speed, hence consuming half the full power. Similarly, the $3^{rd}$ flip-flop 1112 runs at ¼ the speed (=25% of the power), etc.

Therefore, using ripple counters permits to reduce power consumption, although a ripple counter is more difficult to test than a counter in which every flip-flop runs at the same clock. The ripple counter can be loaded with a pre-determined start-value (with the Set/Reset inputs of the flip-flops) and count until 0000. Alternatively, one can start from 0000 and detect that the counter has reached a certain value N_max. The ripple counter may also be modified with some extra logic to permit the counter to count up and down, hence allowing to use a ripple counter in the circuit of FIG. 7.

In the embodiment of FIG. 9, two ripple counters may be used in which each counter counts down from N_max to zero. The frequency of the clock signal CLK may be up to a few GHz. Detecting that a ripple-counter is zero (N=0) can be achieved relatively easily with negligible propagation delay using the NOR gate 1120. Since all bits except for the least-significant bit have all become zero earlier on and the least-significant bit is the first flip-flop in the counter and is clocked by the VCO signal directly; the propagation delay is therefore the delay of only 1 flip-flop and a NOR, whereas it would be a multiple of that delay if checking for an arbitrary number. Pre-loading the counters with an arbitrary value can be done outside the magnetize/demagnetize cycle and is less time critical. A slow control-loop (not shown) can be provided to calculate the best values to be pre-loaded in the counters.

FIG. 12A illustrates a ring oscillator. In this exemplary embodiment the ring oscillator 1200 comprises three inverters, one of the inverters being implemented as part of a NAND gate.

The ring oscillator has a first inverter 1210, a second inverter 1220 and NAND gate 1220, a third inverter 1230 and a buffer 1240. The NAND gate 1220 has a first input for receiving an enable signal from the controller (for instance signal S3 derived from S1 and S2), and a second input for receiving the output of the first inverter 1210. The output of the NAND gate 1220 is fed to the inverter 1230. The output of the inverter 1230 is fed back into the first inverter 1210 in a close loop and to the buffer 1240 which provides the clock signal CLK.

The current signal provided by the voltage-to-current converter 752 becomes the input signal of the ring oscillator 1200.

It will be appreciated that the ring oscillator may be implemented with any odd numbers of inverters greater than one (with NAND also counting as an inverter). For instance, 3, 5 or 7 inverters.

Figure 12B:
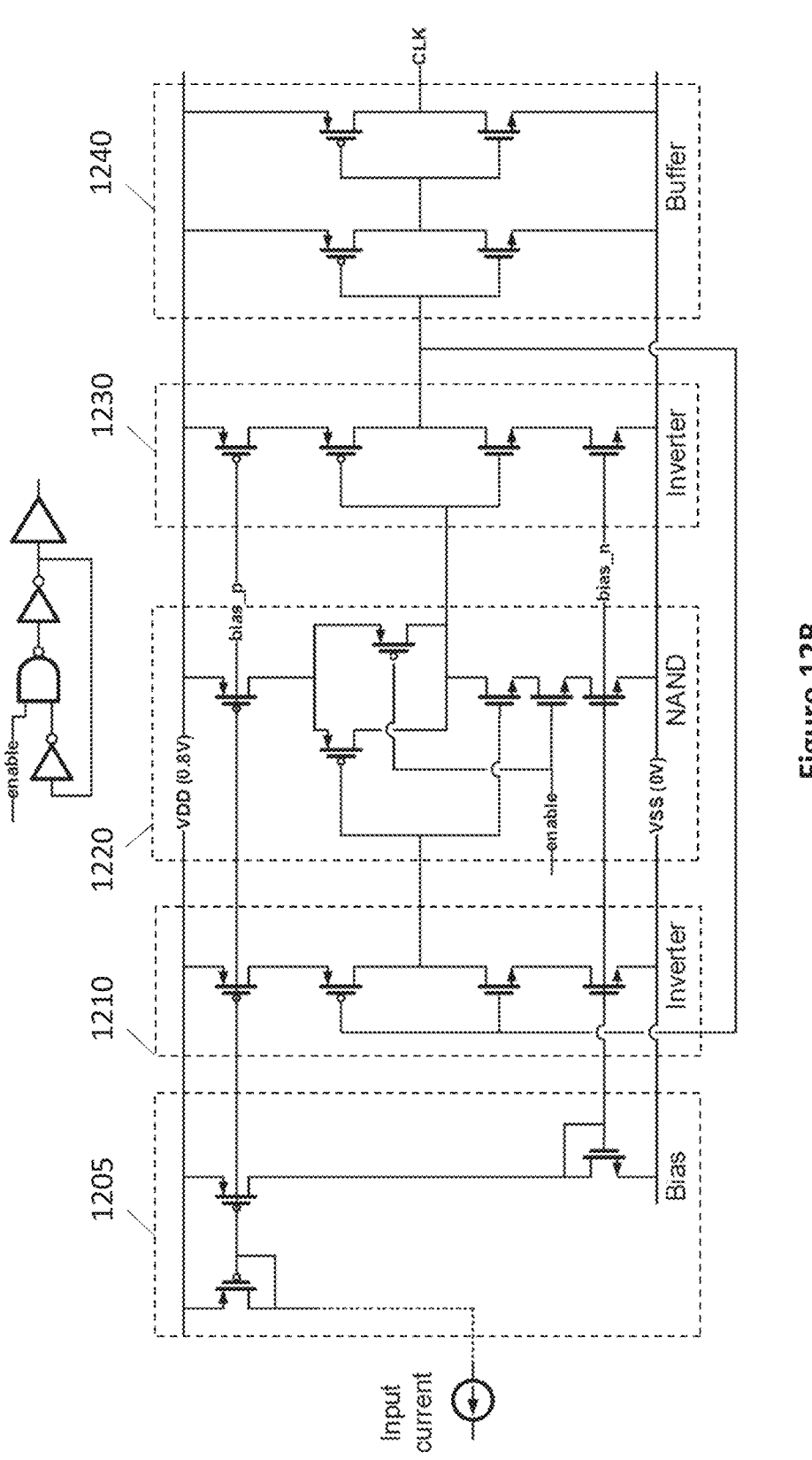
FIG. 12B is a diagram showing an exemplary implementation of the ring oscillator of FIG. 12A.

FIG. 12B illustrates an exemplary implementation of the ring oscillator of FIG. 12A. FIG. 12B shows the input bias stage 1205, the first inverter 1210, the NAND gate (second inverter) 1220, the third inverter 1230 and the buffer 1240.

The ring oscillator 1200 may also be implemented with a pair of differential signals, so that the input signal has two components: a non-inverter signal IN and an inverter signal INn. The output signal provided by the first inverter 1210 becomes the input signal of the second inverter 1220. Similarly, the output signal provided by the second inverter 1220 becomes the input signal of the third inverter 1230.

Figure 13A:
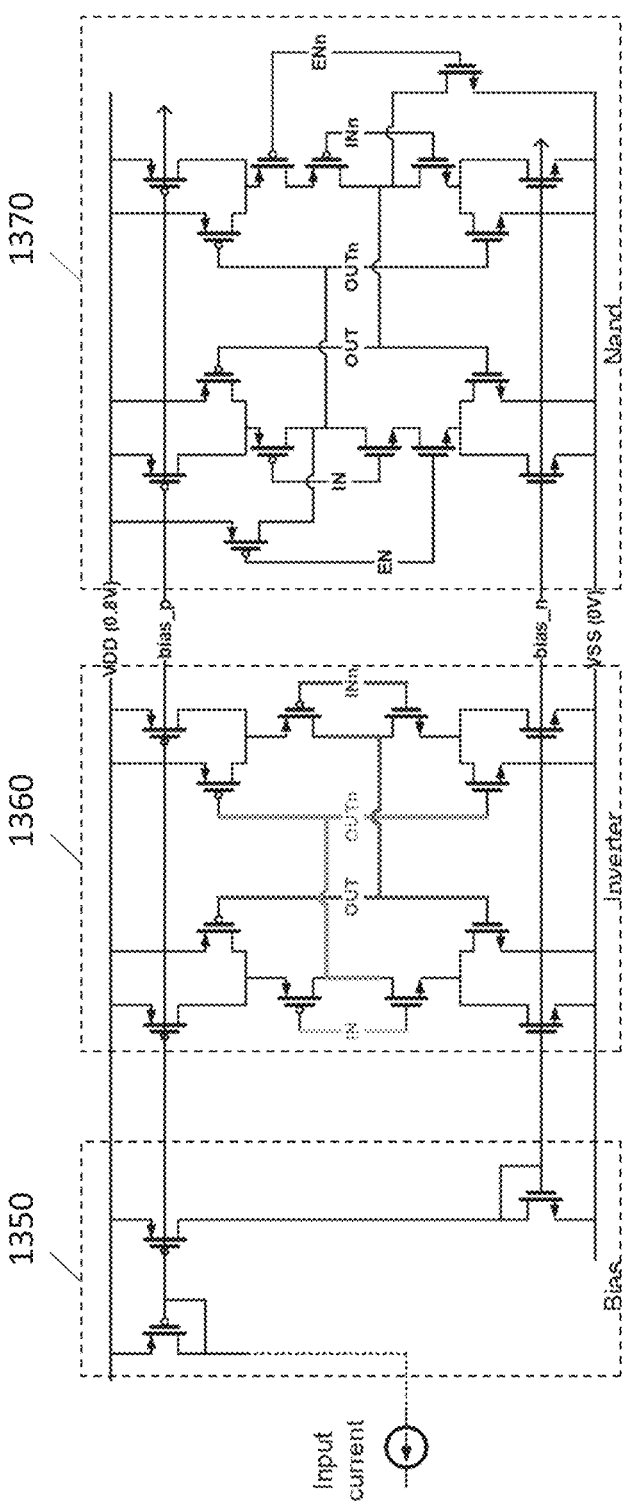
FIG. 13A is a diagram showing aa bias stage, a differential inverter, and a differential NAND gate for another implementation of the ring oscillator of FIG. 12A.

FIG. 13A illustrates an exemplary implementation of a bias stage 1350, a differential inverter 1360, and a differential NAND gate 1370 that may be used as part of a ring oscillator. The transistors connected to bias_p and bias_n are so called long transistors with a saturation current as set by the input current. All other transistors are small minimum-length transistors. The current to frequency ratio is constant or substantially constant up to a few GHz and is in simulation about 200 MHz/μA (before layout). Starting the ring-oscillator happens almost instantly and the current consumption when idle is negligible.

Figure 13B:
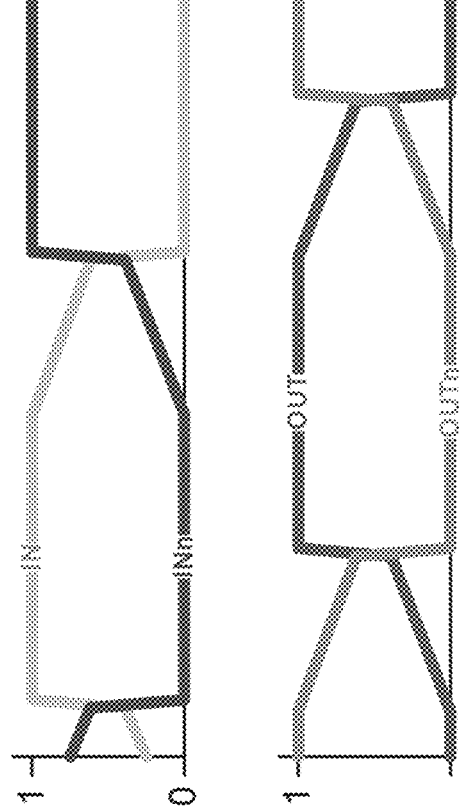
FIG. 13B is a plot showing the input and output waveforms of the differential inverter of FIG. 13A.

FIG. 13B shows the input and output waveforms of a differential inverter of FIG. 13A.

Figure 14:
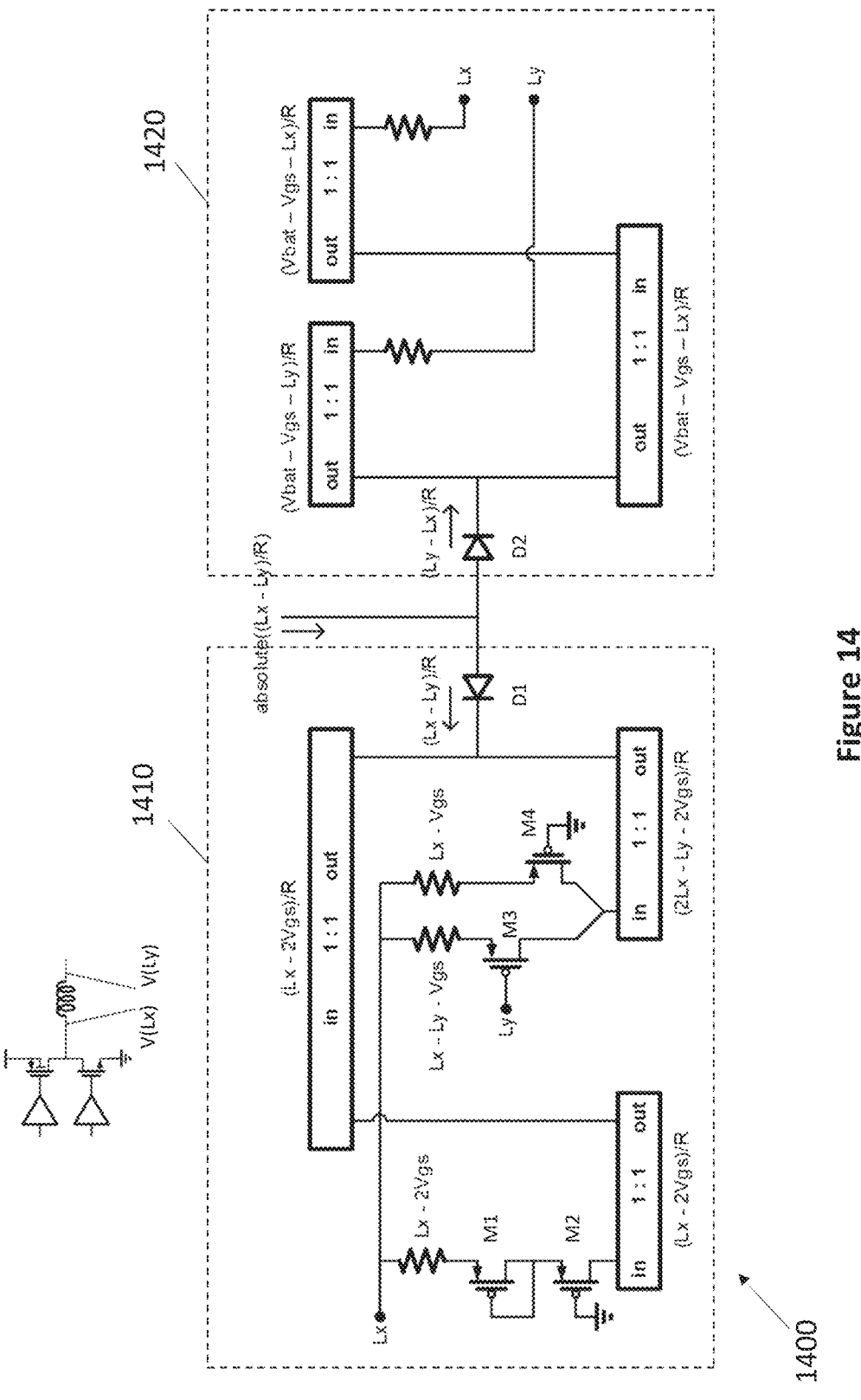
FIG. 14 is a diagram illustrating an implementation of a voltage-to-current converter.

FIG. 14 is a diagram illustrating an implementation of a voltage-to-current converter. The inductor L extends between a switching node X and an output node Y. The voltage to current converter is coupled across the inductor L to receive the inductor voltage V(Lx) from the switching node X and the inductor voltage V(Ly) from the output node Y. For simplicity V(Lx) is noted Lx and V(Ly) is noted Ly in the figure. The voltage Lx can be either an input voltage for instance Vbat or ground.

The voltage to current conversion can be implemented with a simple analog circuit made of resistors and current mirrors. In FIG. 14 the current mirrors are represented by a box "in 1:1 out" showing a 1:1 current ratio. All resistors have an equal value R.

The voltage-to-current converter 1400 is formed of two sub-circuits 1410 and 1420. The sub-circuit 1410 is provided for positive inductor voltages, hence during the magnetizing phase, when V(Lx)>V(Ly). Similarly the sub-circuit 1420 is provided for negative inductor voltages, hence during the demagnetizing phase, when V(Ly)>V(Lx).

Each sub-circuit receives the voltages V(Lx) and V(Ly) and provides an output current signal defined as (V(Lx)−V(Ly))/R for 1410 and (V(Ly)−V(Lx))/R for 1420, in which R is the value of any of the resistors present in the circuit 1400.

The outputs of the sub-circuits are combined with diode-connected transistors to prevent that they work against each other. The current through input and output of the current mirrors is indicated under or above the mirrors.

The detection of the magnetizing phase and the de-magnetizing phase can be performed in various ways. For instance using the control signals for the control of the HS and LS switches directly, or by monitoring the switching node with an inverter. Alternatively it could also be achieved by probing an internal node of the voltage to current converter.

The converter of the disclosure can run with a very low quiescence current, for instance less than 1 μA but, while achieving fast response and very short magnetizing/demag-netizing phases (for instance less than 100 ns). The converter can also be processed in a small technology (for instance 28 nm or smaller).

A skilled person will appreciate that variations of the disclosed arrangements are possible without departing from the disclosure. For instance, although the disclosure has been described with reference to buck converters, the same approach may be applied to boost or buck-boost converters. Accordingly, the above description of the specific embodiments is made by way of example only and not for the purposes of limitation. It will be clear to the skilled person that minor modifications may be made without significant changes to the operation described.

The invention claimed is:

1. A current monitoring circuit for use with an inductor having a magnetizing phase and a de-magnetizing phase, the current monitoring circuit comprising:
   a voltage controlled oscillator adapted to generate a clock signal based on a voltage across the inductor; and
   a first counter configured to generate a counter value using the clock signal.

2. The current monitoring circuit as claimed in claim 1, wherein the counter value is proportional to an inductor current through the inductor.

3. The current monitoring circuit as claimed in claim 1, wherein the clock signal has a frequency proportional to an absolute value of the voltage across the inductor.

4. The current monitoring circuit as claimed in claim 1, wherein the voltage controlled oscillator comprises:
   a voltage to current converter adapted to convert the voltage across the inductor into a current signal; and
   a current controlled oscillator adapted to generate the clock signal based on the current signal.

5. The current monitoring circuit as claimed in claim 4, wherein the current controlled oscillator comprises a ring oscillator.

6. The current monitoring circuit as claimed in claim 5, wherein the ring oscillator comprises a NAND gate coupled to a plurality of inverters.

7. The current monitoring circuit as claimed in claim 1, wherein the clock signal is configured to control a counting frequency of the first counter.

8. The current monitoring circuit as claimed in claim 1, wherein the first counter counts up or down based on a polarity of the voltage across the inductor.

9. The current monitoring circuit as claimed in claim 8, wherein during the magnetizing phase the first counter is counting up from a first counter value to a second counter value, and during a de-magnetizing phase the first counter is counting down from the second counter value to the first counter value.

10. The current monitoring circuit as claimed in claim 1, comprising a second counter.

11. The current monitoring circuit as claimed in claim 10, wherein during the magnetizing phase the second counter counts from an initial counter value to an end counter value, and during the de-magnetizing phase the first counter counts from the initial counter value to the end counter value.

12. The current monitoring circuit as claimed in claim 10, wherein the first and second counters are ripple counters.

13. The current monitoring circuit as claimed in claim 1, wherein the voltage to current converter comprises a first circuit configured to generate a current signal during the magnetizing phase, and a second circuit configured to generate a current signal during the de-magnetizing phase.

14. A switched mode power supply comprising:

an inductor coupled to a pair of power switches;

a current monitoring circuit comprising a voltage controlled oscillator adapted to generate a clock signal based on a voltage across the inductor; and a first counter configured to generate a counter value using the clock signal; and a controller adapted to generate a control signal to control the pair of power switches based on the counter value.

15. The switched mode power supply as claimed in claim 14, wherein the voltage controlled oscillator comprises:

a voltage to current converter adapted to convert the voltage across the inductor into a current signal; and a current controlled oscillator adapted to generate the clock signal based on the current signal.

16. The switched mode power supply as claimed in claim 14, wherein the pair of power switches comprises a first power switch and a second power switch, the controller being operable in three states: a first state during which the first power switch is on, while the second power switch is off to magnetize the inductor, a second state during which the first power switch is off while the second power switch is on to de-magnetize the inductor and a third state during which the first and second power switches are both off.

17. The switched mode power supply as claimed in claim 16, wherein during the first state the counter value increases from a first counter value to a second counter value, and when the counter value reaches the second counter value the controller starts operating in the second state during which the counter value decreases from a second counter value to a first counter value.

18. The switched mode power supply as claimed in claim 16, wherein in the third state the controller is configured to disable the voltage to current converter and the oscillator and to reset the first counter.

19. The switched mode power supply as claimed in claim 14, comprising a second counter wherein during a magnetizing phase of the inductor, the second counter counts from an initial counter value to an end counter value, and during de-magnetizing phase of the inductor, the first counter counts from the initial counter value to the end counter value.

20. The switched mode power supply as claimed in claim 19, wherein the controller is configured to change state when the counter value reaches the end value.

21. The switched mode power supply as claimed in claim 14, comprising a calibration circuit configured to calibrate the counter value and to calculate an absolute value of the current through the inductor.

22. The switched mode power supply as claimed in claim 14, wherein the power supply has a switching frequency, and wherein the voltage controlled oscillator operates at a frequency greater than the switching frequency.

23. A method of monitoring an inductor current comprising:

generating with a voltage controlled oscillator a clock signal based on a voltage across the inductor; and generating with a first counter a counter value using the clock signal to monitor the inductor current.

24. The method as claimed in claim 23, wherein the inductor is coupled to a pair of power switches of a switched mode power supply, the method further comprising:

generating a control signal to control the pair of power switches based on the counter value.

* * * * *